(12) United States Patent
Ting et al.

(10) Patent No.: US 10,916,530 B2
(45) Date of Patent: Feb. 9, 2021

(54) ELECTRONIC DEVICE

(71) Applicant: InnoLux Corporation, Miao-Li County (TW)

(72) Inventors: Chin-Lung Ting, Miao-Li County (TW); Ming-Chun Tseng, Miao-Li County (TW); Chi-Liang Chang, Miao-Li County (TW)

(73) Assignee: InnoLux Corporation, Miao-Li County (TW)

( * ) Notice: Subject to any disclaimer, the term of this patent is extended or adjusted under 35 U.S.C. 154(b) by 0 days.

(21) Appl. No.: 16/365,696

(22) Filed: Mar. 27, 2019

(65) Prior Publication Data

US 2019/0326265 A1 Oct. 24, 2019

Related U.S. Application Data

(60) Provisional application No. 62/660,234, filed on Apr. 19, 2018.

(30) Foreign Application Priority Data

Sep. 20, 2018 (CN) .......................... 2018 1 1101954

(51) Int. Cl.
| | | |
|---|---|---|
| *H01L 25/13* | (2006.01) | |
| *H01L 33/62* | (2010.01) | |
| *H01L 33/58* | (2010.01) | |
| *H01L 33/60* | (2010.01) | |
| *H01L 33/50* | (2010.01) | |

(52) U.S. Cl.
CPC ............ *H01L 25/13* (2013.01); *H01L 33/504* (2013.01); *H01L 33/58* (2013.01); *H01L 33/60* (2013.01); *H01L 33/62* (2013.01)

(58) Field of Classification Search
None
See application file for complete search history.

(56) References Cited

U.S. PATENT DOCUMENTS

| | | | |
|---|---|---|---|
| 9,018,651 B2* | 4/2015 | Ahn .................... | H01L 33/64 257/93 |
| 2015/0373793 A1* | 12/2015 | Bower ................. | H01L 33/385 362/20 |
| 2016/0027971 A1* | 1/2016 | Anc ..................... | C09K 11/025 257/98 |
| 2017/0102797 A1* | 4/2017 | Cok ..................... | H01L 33/60 |
| 2017/0103966 A1* | 4/2017 | Choi ................... | H01L 25/0655 |
| 2017/0133357 A1* | 5/2017 | Kuo ..................... | H01L 25/167 |
| 2017/0155020 A1* | 6/2017 | Lin ...................... | H01L 33/507 |
| 2017/0179348 A1* | 6/2017 | Oyamada ............. | H01L 33/486 |
| 2017/0309793 A1* | 10/2017 | Seo ...................... | H01L 33/38 |
| 2017/0342320 A1* | 11/2017 | Tsumori ............... | C09K 11/616 |
| 2018/0062052 A1* | 3/2018 | Bohmer ................ | H01L 33/50 |
| 2018/0175265 A1* | 6/2018 | Kim ..................... | H01L 33/60 |
| 2018/0351054 A1* | 12/2018 | Chen ................... | H01L 33/508 |
| 2019/0221724 A1* | 7/2019 | Song ................... | H01L 33/507 |

(Continued)

*Primary Examiner* — Evren Seven
(74) *Attorney, Agent, or Firm* — Winston Hsu

(57) ABSTRACT

An electronic device includes a substrate, a plurality of metal pads, and a plurality of light emitting diodes. The metal pads are disposed on the substrate and form an array. Each of the light emitting diodes is electrically connected to at least two of the metal pads. The metal pads include a plurality of dummy metal pads electrically isolated to the light emitting diodes.

17 Claims, 14 Drawing Sheets

(56) References Cited

U.S. PATENT DOCUMENTS

| | | | |
|---|---|---|---|
| 2019/0221728 A1* | 7/2019 | Yu | H01L 33/507 |
| 2019/0237634 A1* | 8/2019 | Nakabayashi | H01L 33/58 |
| 2019/0267524 A1* | 8/2019 | Bohmer | H01L 33/60 |
| 2019/0319016 A1* | 10/2019 | Zhang | H01L 33/52 |
| 2019/0326480 A1* | 10/2019 | You | H01L 33/26 |
| 2020/0075558 A1* | 3/2020 | Jingi | H01L 33/62 |

* cited by examiner

ELECTRONIC DEVICE

CROSS REFERENCE TO RELATED APPLICATION

This application claims the benefit of U.S. Provisional Patent Application No. 62/660,234, filed on Apr. 19, 2018.

BACKGROUND OF THE DISCLOSURE

1. Field of the Disclosure

The present disclosure relates to an electronic device, and more particularly to an electronic device including a plurality of light emitting diodes and a plurality of dummy metal pads.

2. Description of the Prior Art

In recent years, electronic products with displays such as mobile phones, tablet computers, vehicle devices or public information display (PID) have been developing toward thinness and low power consumption. Self-luminous display devices such as inorganic light-emitting diode displays (LED) have gradually received more attention due to their simpler structure comparing to back lighting display devices. In order to apply PIDs or displays of outdoor billboards to various environments, it is necessary to solve the problem that the image display quality may be affected by the reflected light caused by the ambient light illuminating the display device. Therefore, innovations of designs for improving user's viewing quality of display devices are subjects that need continuous efforts by people in this field.

SUMMARY OF THE DISCLOSURE

An electronic device includes a substrate, a plurality of metal pads, and a plurality of light emitting diodes. The metal pads are disposed on the substrate and form an array. Each of the light emitting diodes is electrically connected to at least two of the metal pads. The metal pads include a plurality of dummy metal pads electrically isolated to the light emitting diodes.

These and other objectives of the present disclosure will no doubt become obvious to those of ordinary skill in the art after reading the following detailed description of the embodiment that is illustrated in the various figures and drawings.

DETAILED DESCRIPTION

The present disclosure may be understood by reference to the following detailed description, taken in conjunction with the drawings as described below. For purposes of illustrative clarity understood, various drawings of this disclosure show a portion of the electronic device, and certain elements in various drawings may not be drawn to scale. In addition, the number and dimension of each device shown in drawings are only illustrative and are not intended to limit the scope of the present disclosure.

Certain terms are used throughout the description and following claims to refer to particular components. As one skilled in the art will understand, electronic equipment manufacturers may refer to a component by different names. This document does not intend to distinguish between components that differ in name but not function. In the following description and in the claims, the terms "include", "comprise" and "have" are used in an open-ended fashion, and thus should be interpreted to mean "include, but not limited to".

When an element or layer is referred to as being "on" or "connected to" another element or layer, it can be directly on or directly connected to the other element or layer, or intervening elements or layers may be presented. In contrast, when an element is referred to as being "directly on" or "directly connected to" another element or layer, there are no intervening elements or layers presented.

The technical features in different embodiments described in the following can be replaced, recombined, or mixed with one another to constitute another embodiment without departing from the spirit of the present disclosure.

Figure 1:
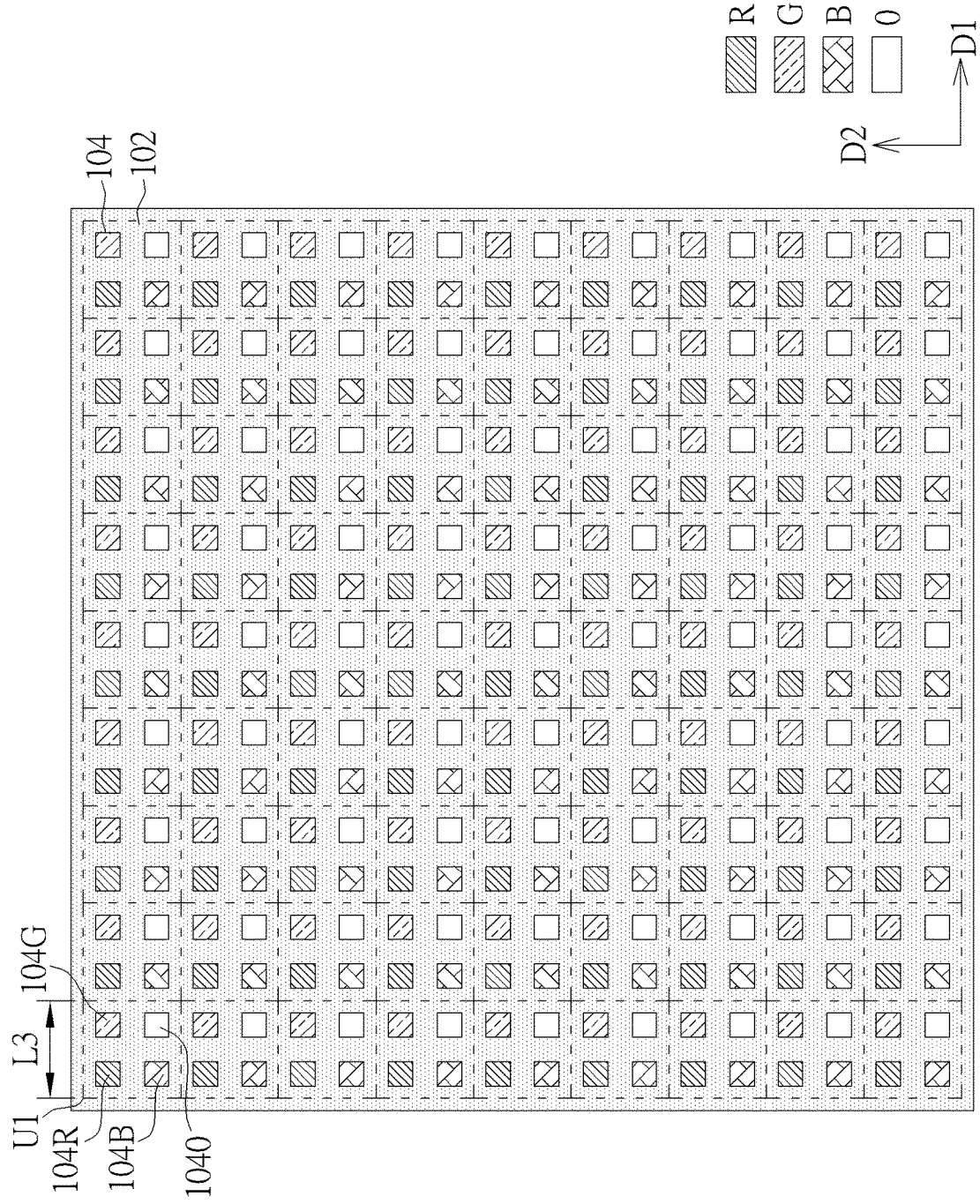
FIG. 1 is a schematic diagram illustrating a top view of a substrate of an electronic device according to a first embodiment of the present disclosure.
Figure 2:
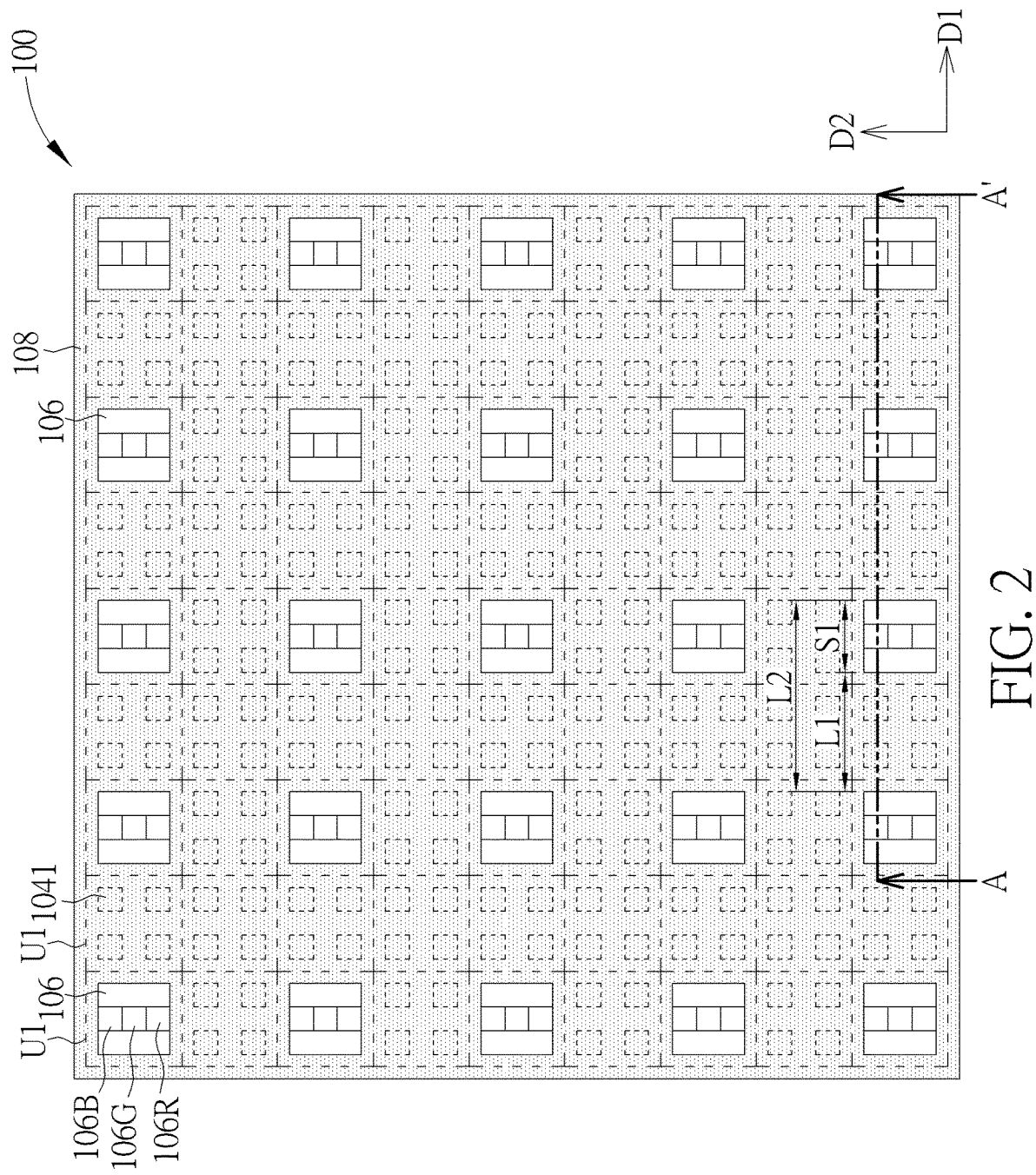
FIG. 2 is a schematic diagram illustrating a top view of the electronic device according to the first embodiment of the present disclosure.
Figure 3:
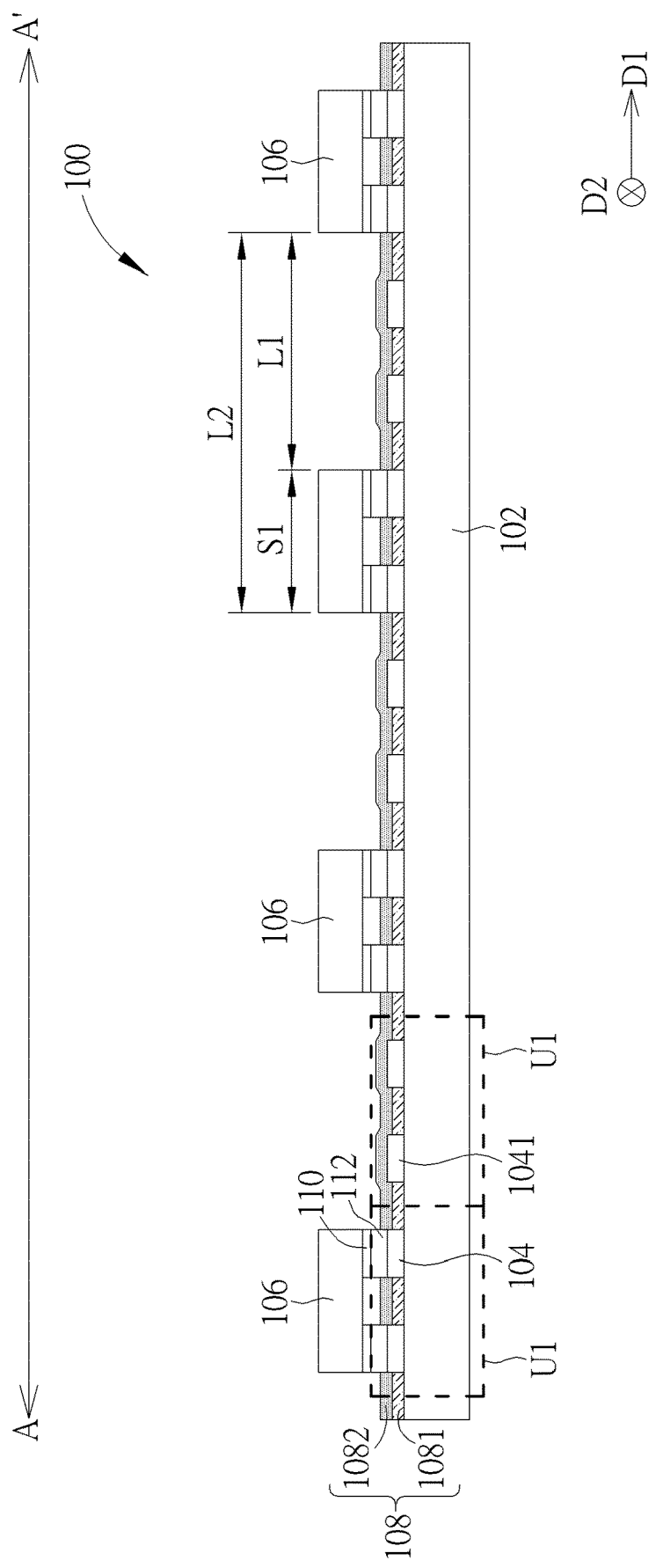
FIG. 3 is a schematic diagram illustrating a cross-sectional view of the electronic device taken along line A-A' in FIG. 2.

Referring to FIG. 1 to FIG. 3, FIG. 1 is a schematic diagram illustrating a top view of a substrate of an electronic device according to a first embodiment of the present disclosure, FIG. 2 is a schematic diagram illustrating a top view of the electronic device according to the first embodiment of the present disclosure, and FIG. 3 is a schematic diagram illustrating a cross-sectional view of the electronic device taken along line A-A' in FIG. 2. FIG. 1 is the schematic diagram illustrating the top view of the substrate of the electronic device of the present disclosure with metal pads but without light emitting diodes disposed thereon. The electronic device of the first embodiment of the present disclosure includes a substrate 102, a plurality of metal pads 104, and a plurality of light emitting diodes 106. The substrate 102 may be a circuit board or a thin film transistor (TFT) substrate for example, but not limited thereto. The metal pads 104 are disposed on the substrate 102 and along a first direction D1 and a second direction D2 to form an array. The first direction D1 may be perpendicular to the second direction D2, but not limited thereto. Specifically, the substrate 102 may include circuits or conductive lines electrically connected to the metal pads 104, and the circuits may include TFTs or integrated circuits. These circuits or conductive lines may be electrically connected to electronic devices (such as the light emitting diodes 106) disposed on the substrate 102 through the metal pads 104, but not limited thereto. A plurality of basic units U1 are defined on the substrate 102, and the basic units U1 are arranged as an array along the first direction D1 and the second direction D2. Each of the basic units U1 includes at least two metal pads 104 disposed on the substrate 102, but the number and locations of the metal pads 104 may be adjusted according to the designs of circuits or conductive lines in the substrate 102. In this embodiment, the basic unit U1 includes four metal pads 104 which respectively are metal pad 104O, metal pad 104R, metal pad 104G, and metal pad 104B. These four metal pads 104 can be used for electrically connecting the light emitting diode 106 formed thereon, but not limited thereto.

In this embodiment, in the array of the metal pads 104, the distance between adjacent two metal pads 104 may be identical. For example, the distance between any adjacent two metal pads 104 in the first direction D1 may be identical, and the distance between any adjacent two metal pads 104 in the second direction D2 may be identical, but not limited thereto. The distance between adjacent two metal pads 104 in the same basic unit U1 may be the same as the distance between adjacent two metal pads 104 in different basic units U1, but not limited thereto. In some embodiments, the distance between adjacent two metal pads 104 in the same basic unit U1 may be different from the distance between adjacent two metal pads 104 in different basic units U1.

As shown in FIG. 2, each of the light emitting diodes 106 of the electronic device 100 is disposed on the substrate 102 and covers and electrically connects multiple metal pads 104. In this embodiment, each of the light emitting diodes 106 is disposed corresponding to one of the basic units U1 of the substrate 102. The light emitting diode 106 may be, for example, a package in which one or more light emitting diode chips (LED chips) may be packaged. For example, each of the light emitting diodes 106 may include three LED chips in this embodiment. For example, the three LED chips may include a chip 106R, a chip 106G, and a chip 106B that can emit different colors of lights, and the chip 106R, the chip 106G, and the chip 106B may respectively emit red light, green light, and blue light, but not limited thereto. As shown in FIG. 3, the light emitting diode 106 includes at least two conductive pads 110 disposed at the bottom of the light emitting diode 106. For example, the light emitting diode 106 of this embodiment may include four conductive pads 110, and these four conductive pads 110 of the light emitting diode 106 may respectively be bonded and electrically connected to the metal pad 104O, the metal pad 104R, the metal pad 104G, and the metal pad 104B in the basic unit U1 through the solder layer 112 by the surface mount technology (SMT), but not limited thereto. The metal pad 104O may be electrically connected to the common cathode or the common anode of the LED chips 106R, 106G, 106B in the light emitting diode 106, and the metal pad 104R, the metal pad 104G, and the metal pad 104B respectively may be electrically connected to the chip 106R, the chip 106G, and the chip 106B through corresponding conductive pads 110 in each of the light emitting diodes 106. Accordingly, each of the light emitting diodes 106 of the electronic device 100 may emit red light, blue light, green light, or white light to display an image, but not limited thereto. In other embodiments, if the light emitting diode is only packaged with one light emitting diode chip, the light emitting diode then may include two conductive pads disposed at the bottom of the light emitting diode, and the two conductive pads may be electrically connected to two metal pads.

In this embodiment, as shown in FIG. 2 and FIG. 3, one of the basic units U1 is disposed between adjacent two light emitting diodes 106 disposed on the substrate 102 in the first direction D1 or the second direction D2, and this basic unit U1 may not be covered by nor electrically connected to the light emitting diode 106. Four metal pads 104 in the basic unit U1 disposed between adjacent two light emitting diodes 106 are electrically isolated to the light emitting diodes 106, and the metal pads 104 that are electrically isolated to the light emitting diodes 106 may be defined as dummy metal pads 104I. The dummy metal pads 104I may be floated or grounded, but not limited thereto. Specifically, a gap L1 may be defined by a distance between adjacent two light emitting diodes 106 in the first direction D1 or the second direction D2, and a pitch L2 may be defined by a sum of a length S1 of one of the light emitting diodes 106 and the gap L1 in the direction. In some embodiments, the pitch L2 may be 1.2 times to 20 times the length S1 of the one of the light emitting diodes 106 in the direction, but not limited thereto. At least one of the dummy metal pads 104I that is not covered by the light emitting diode 106 may be disposed between adjacent two light emitting diodes 106. In another aspect, at least one of the dummy metal pads 104I disposed between adjacent two light emitting diodes 106 may be exposed by the light emitting diode 106. For example, as shown in FIG. 3, one of the basic units U1 including the dummy metal pads 104I may be disposed between adjacent two light emitting diodes 106 in the first direction D1, and therefore two dummy metal pads 104I may be disposed between adjacent two light emitting diodes 106 in the first direction D1. In this embodiment, the length of the basic unit U1 may be defined as the minimum pitch L3, or the distance between the centers of adjacent two basic units U1 may be defined as the minimum pitch L3. In this embodiment, the pitch L2 may be, for example, twice the minimum pitch L3, but not limited thereto. In some embodiments, the pitch L2 may be twice, three times, or four times the minimum pitch L3, but not limited thereto. Therefore, manufacturers may use the same substrate 102 and the same array formed of the metal pads 104 and may dispose the light emitting diodes 106 with different pitches L2 to manufacture different electronic devices 100 according to different requirements.

In addition, the electronic device 100 of the present disclosure may further include a cover layer 108 covering the substrate 102 and a portion of the metal pads 104, but the light emitting diodes 106 may not be covered by the cover layer 108 and may be exposed. Specifically, the cover layer 108 may include the single-layer or multilayer film and may include the organic or inorganic material, such as a colored paint layer or an insulating layer, but not limited thereto. In this embodiment, the cover layer 108 may include an insulating layer 1081 and a colored paint layer (such as a black paint layer 1082) disposed on the insulating layer 1081, and the cover layer 108 may cover the dummy metal pads 1041 that are not electrically connected to the light emitting diodes 106 for protecting and electrically isolating the dummy metal pads 1041. However, the cover layer 108 may not cover the metal pads 104 electrically connected to the light emitting diodes 106, or the cover layer 108 may cover a portion of the metal pads 104 electrically connected to the light emitting diodes 106. The method of patterning the cover layer 108 may include the lithography process, but not limited thereto. The reflection of the ambient light incident on the surface of the substrate 100 can be reduced by covering the substrate 100 and the dummy metal pads 1041 with the black paint layer 1082. In some embodiments, the black paint layer 1082 may include the single-layer insulating black sealant.

Figure 4:
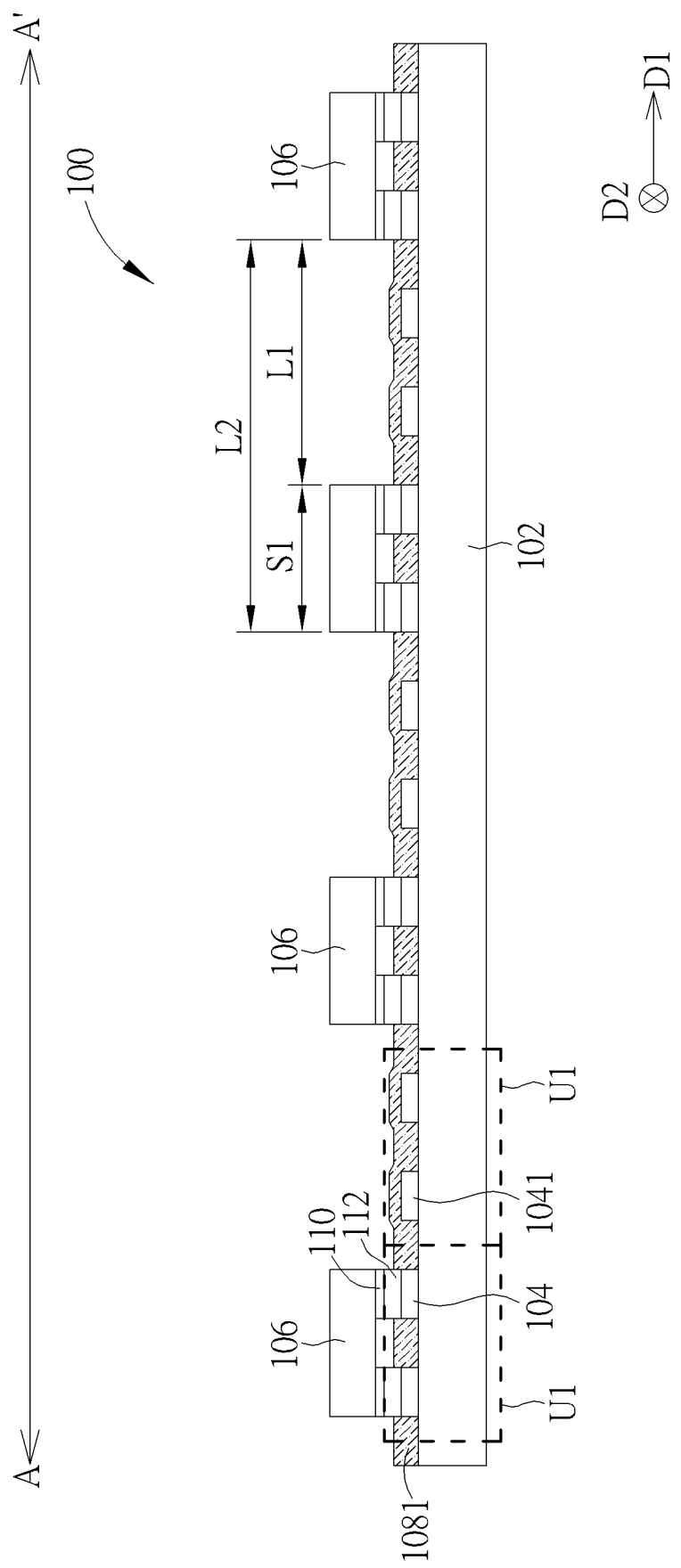
FIG. 4 is a schematic diagram illustrating a cross-sectional view of an electronic device according to a variant embodiment of the first embodiment of the present disclosure.

Referring to FIG. 1, FIG. 2, and FIG. 4, FIG. 4 is a schematic diagram illustrating a cross-sectional view of an electronic device according to a variant embodiment of the first embodiment of the present disclosure. As shown in FIG. 4, the electronic device 100 may include the insulating layer 1081 but without the black paint layer 1082 disposed therein. In some embodiments, the electronic device 100 may include the black paint layer 1082 but without the insulating layer 1081 disposed therein, or the electronic device 100 may not include the cover layer 108. In some embodiments, a portion of the dummy metal pads 1041 may protrude from the cover layer 108.

The electronic device 100 of this embodiment may be the light emitting diode display device or the backlight source used in the display device. The light emitting diodes 106 may include normal light emitting diode (normal LED) devices, mini light emitting diodes (mini LED), micro light emitting diodes (micro LED), or quantum dot light emitting diodes (QLED), but not limited thereto. The chip size (length or width) of the normal light emitting diode may be about 300 micrometers (μm) to 10 millimeters (mm), the chip size of the mini LED may be about 100 μm to 300 μm, the chip size of the micro LED may be about 1 μm to 100 μm, but not limited thereto. The light emitting diode 106 may include a light emitting diode having the package structure or a light emitting diode without the package structure. For example, the light emitting diodes 106 in this embodiment may be mini LEDs having the package structures. In some embodiments, the electronic device 100 may be used as a public information display (PID) or a light emitting diode display device of a large outdoor display billboard. The electronic devices 100 may also be connected to each other to form larger display screen, but not limited thereto.

Figure 5:
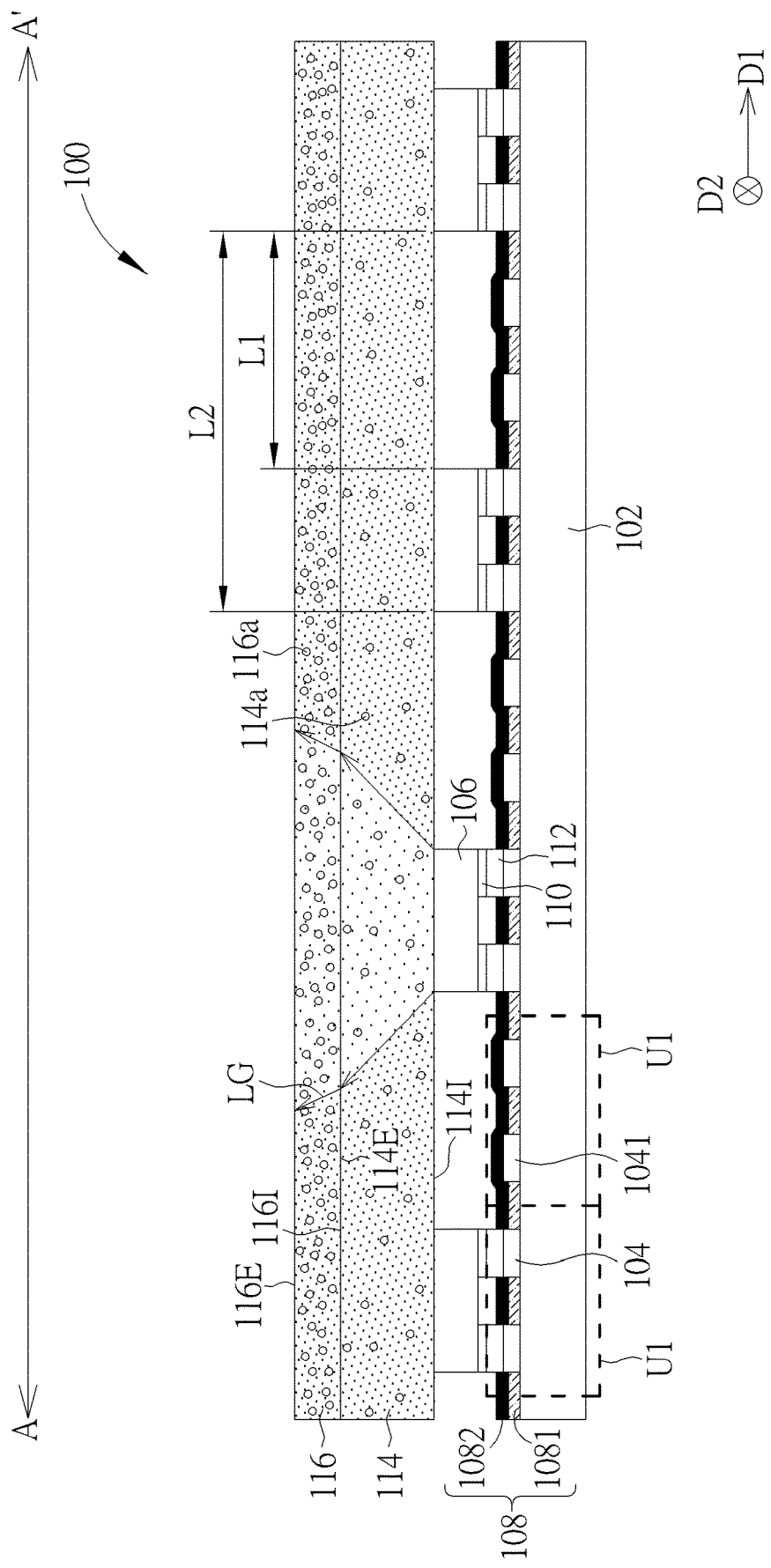
FIG. 5 is a schematic diagram illustrating a cross-sectional view of an electronic device according to a variant embodiment of the first embodiment of the present disclosure.

Referring to FIG. 1, FIG. 2, and FIG. 5, FIG. 5 is a schematic diagram illustrating a cross-sectional view of an electronic device according to a variant embodiment of the first embodiment of the present disclosure. Different from the first embodiment, the electronic device 100 of this variant embodiment shown in FIG. 5 may further include a first diffusion layer 114 and a second diffusion layer 116. The first diffusion layer 114 may be disposed on the substrate 102 and the light emitting diodes 106, and the second diffusion layer 116 may be disposed on the first diffusion layer 114. Specifically, the first diffusion layer 114 may be adhered to the light emitting diodes 106 through the adhesive (not shown), but not limited thereto. Alight LG emitted by the light emitting diodes 106 may be diverged by the first diffusion layer 114 and enter into the second diffusion layer 116, and the light LG may be diverged by the second diffusion layer 116 and emitted from a light emitting surface 116E of the second diffusion layer 116, but not limited thereto. The first diffusion layer 114 may include light diffusion beads 114a or bubbles dispersed therein. The light diffusion beads 114a or bubbles may be used to refract, reflect, or scatter the light LG and change the traveling direction of the light LG, resulting in the effect of diverging, haloing, and/or hazing the light LG. The effect of diverging or hazing the light LG caused by the first diffusion layer 114 may be more obvious when the density of the light diffusion beads 114a or bubbles in the first diffusion layer 114 is higher, or the effect of diverging or hazing the light LG may be achieved by the uneven light emitting surface formed by changing the surface roughness of the first diffusion layer 114. Therefore, the haze of the first diffusion layer 114 may be adjusted through adding the light diffusion beads or changing the surface roughness, but not limited thereto. For example, the surface roughness of the light emitting surface 114E of the first diffusion layer 114 may be in a range from 0.01 pra to 10 μm. The haze of the first diffusion layer 114 may be less than 50% by changing the surface roughness or adding the light diffusion beads 114a. It is noteworthy that the above-mentioned surface roughness may be the arithmetical mean deviation (Ra), and the measuring method of the above-mentioned haze may be performed according to ASTM D1003 and may satisfy the following equation.

$$\text{Haze} = \frac{T_{dif}}{T_t} \cdot 100\%$$

In this equation, $T_t$ may be the total transmittance, $T_{dif}$ may be the diffusion transmittance, and the diffusion transmittance $T_{dif}$ may be identical to the difference between the total transmittance $T_t$ and the equal angle transmittance $T_s$. In some variant embodiments, the surface roughness of the light incident surface 1141 and the surface roughness of the light emitting surface 114E of the first diffusion layer 114 may be adjusted simultaneously to achieve the effect of diverging or hazing the light LG. For example, the first diffusion layer 114 may be a temporary protective film, a translucent black film, a translucent optical material, or an air layer, but not limited thereto. In addition, the effect of diverging or hazing the light LG may be improved when the thickness of the first diffusion layer 114 is larger. Therefore, the thickness of the first diffusion layer 114 in this embodiment may be adjusted according to the pitch L2 of the light emitting diodes 106, and there may be almost no gap between the lights LG of the light emitting diodes 106 or the uniformity of the lights LG may be improved. That is to say, the thickness of the first diffusion layer 114 may be correspondingly increased when the pitch L2 of the light emitting diodes 106 is larger, but not limited thereto. The thickness of the first diffusion layer 114 may be reduced to achieve thinning or lightening effect when the pitch L2 of the light emitting diodes 106 is smaller, but not limited thereto.

In addition, the second diffusion layer 116 of this embodiment may be similar to the first diffusion layer 114 and may include the light diffusion beads 116a or bubbles, the effect of diverging or hazing the light LG may be achieved by the uneven surface through changing the surface roughness of a light emitting surface 116E and/or the surface roughness of a light incident surface 1161 of the second diffusion layer 116, and it will not be redundantly described herein. It is noteworthy that the first diffusion layer 114 and the second diffusion layer 116 of this embodiment may have different hazes, surface roughnesses, and/or thicknesses. The density of the light diffusion beads 116a or bubbles in the second diffusion layer 116 may be greater than the density of the light diffusion beads 114a or bubbles in the first diffusion layer 114, and the surface roughness of the second diffusion layer 116 may be greater than the surface roughness of the first diffusion layer 114. The surface roughness of the light emitting surface 116E and/or the light incident surface 1161 of the second diffusion layer 116 may be in a range from 10 μm to 100 μm, but not limited thereto. The second diffusion layer 116 may diverge or haze the light LG more effectively than the first diffusion layer 114 by adding the light diffusion beads 116a, bubbles, or changing the surface roughness. That is to say, the haze of the second diffusion layer 116 may be greater than the haze of the first diffusion layer 114, for example, the haze of the second diffusion layer 116 may be greater than or equal to 50%, but not limited thereto. The material of the second diffusion layer 116 may be similar to that of the first diffusion layer 114 described above and will not be redundantly described herein.

In some variant embodiments, the surface roughness of the light emitting surface 116E of the second diffusion layer 116 may be greater than the surface roughness of the light incident surface 1161 of the second diffusion layer 116, the surface roughness of the light emitting surface 114E of the first diffusion layer 114, and the surface roughness of the light incident surface 1141 of the first diffusion layer 114. In another variant embodiment, the surface roughness of the light emitting surface 116E of the second diffusion layer 116, the surface roughness of the light incident surface 1161 of the second diffusion layer 116, and the surface roughness of the light emitting surface 114E of the first diffusion layer 114 may be greater than the surface roughness of the light incident surface 1141 of the first diffusion layer 114. In still another variant embodiment, the surface roughness of the light incident surface 1161 of the second diffusion layer 116 and the surface roughness of the light emitting surface 114E of the first diffusion layer 114 may be greater than the surface roughness of the light emitting surface 116E of the second diffusion layer 116 and the surface roughness of the light incident surface 1141 of the first diffusion layer 114. In some variant embodiments, the thickness of the second diffusion layer 116 may be less than the thickness of the first diffusion layer 114. Overall, when the sizes of the light emitting diodes 106 are small, the original light emitting range of the light emitting diodes 106 can be expanded by disposing the single-layer or multilayer diffusion layer, that is, the distance between the images finally emitted by the light emitting diodes 106 from the light emitting surface of the diffusion layer can be reduced, so that the light emitting surface of the electronic device 100 can provide a more uniform brightness, or the image offset caused by dislocations of the light emitting diodes 106 or lamp boards can be reduced, but not limited thereto. Further, the thickness of the first diffusion layer 114 and/or the thickness of the second diffusion layer 116 may be correspondingly increased when the pitch L2 of the light emitting diodes 106 is larger, but not limited thereto. In some variant embodiments, the electronic device 100 may include single diffusion layer, for example, the electronic device 100 may include the first diffusion layer 114 but without the second diffusion layer 116.

The following description will detail the different embodiments of the present disclosure. To simplify the description, the following description will detail the dissimilarities among different embodiments and the identical features will not be redundantly described. For making it easier to understand the differences between the embodiments, identical components in each of the following embodiments are marked with identical symbols.

Figure 6:
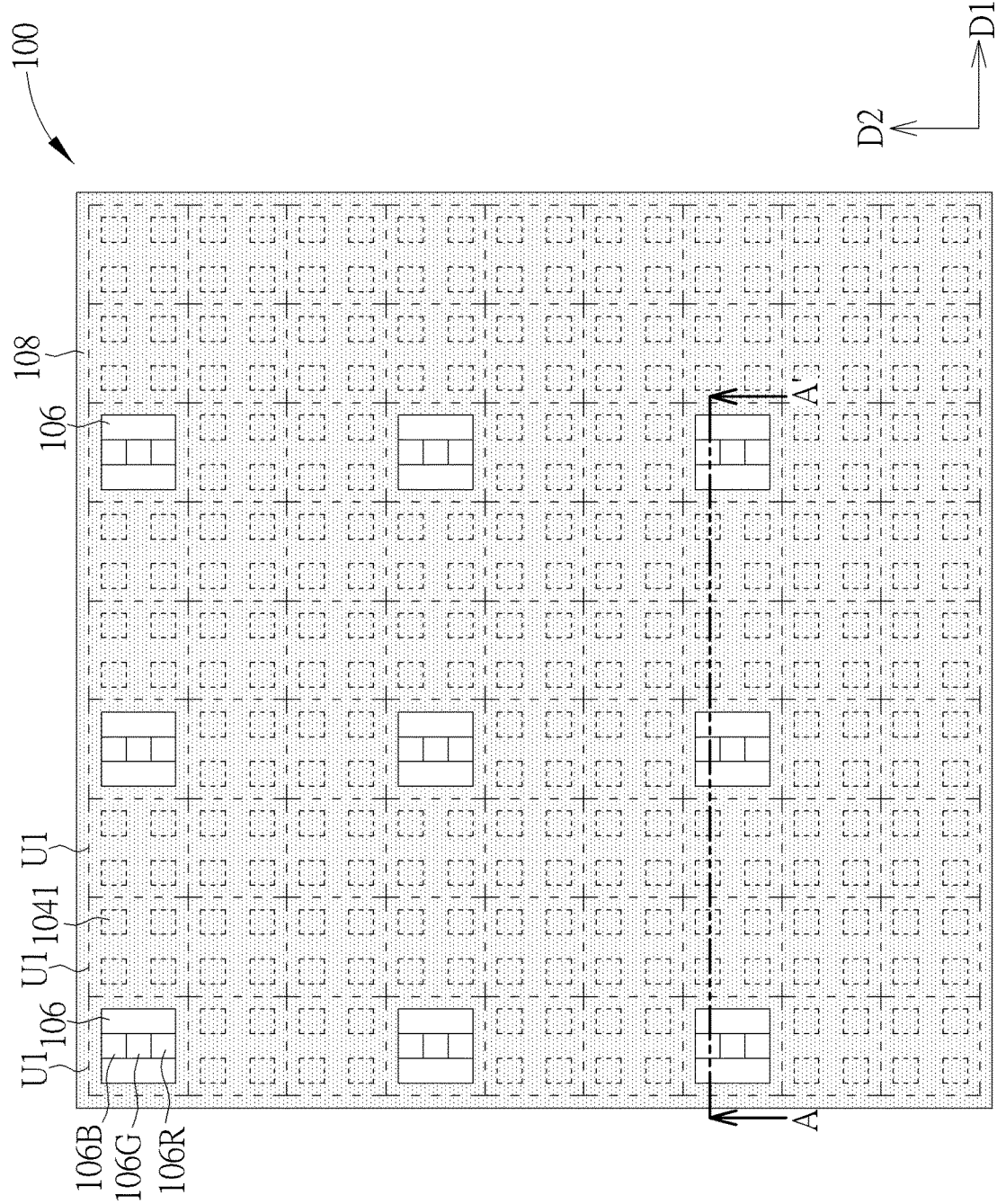
FIG. 6 is a schematic diagram illustrating a top view of an electronic device according to a second embodiment of the present disclosure.
Figure 7:
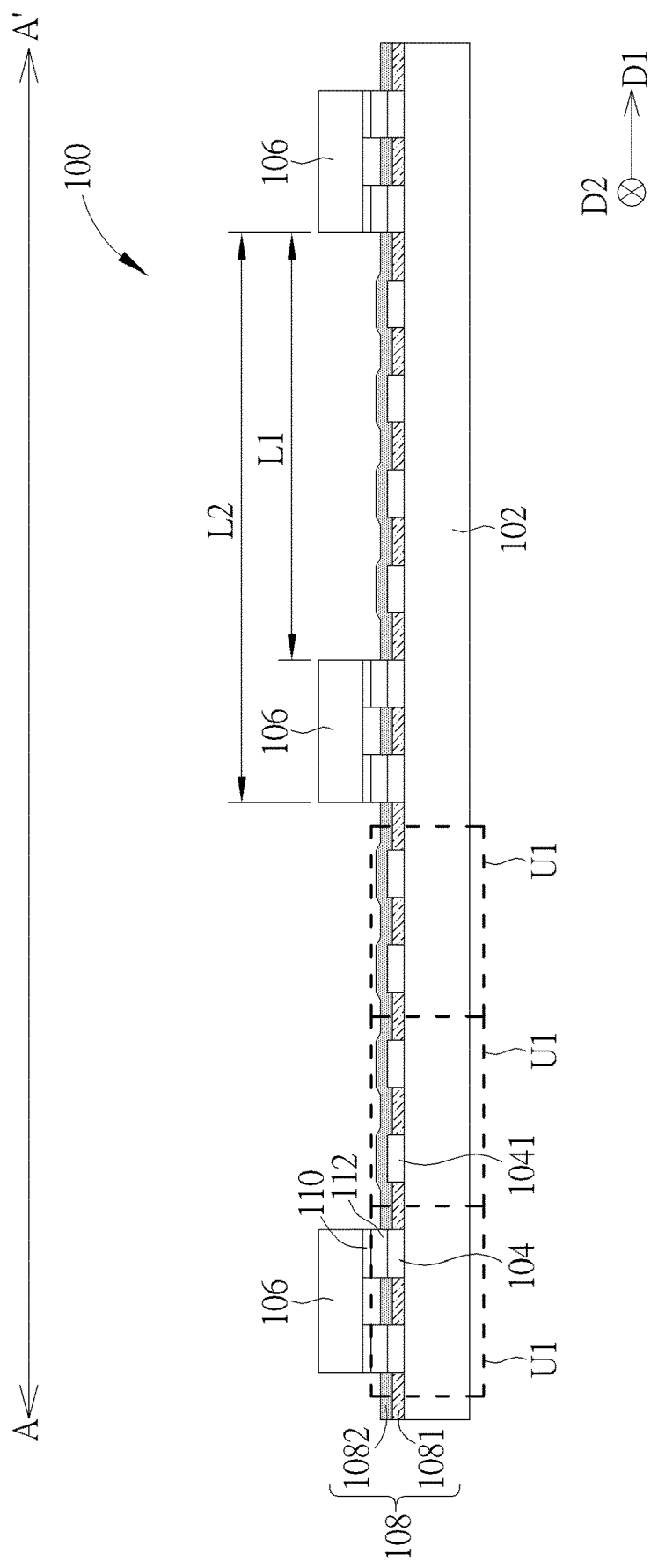
FIG. 7 is a schematic diagram illustrating a cross-sectional view of the electronic device taken along line A-A' in FIG. 6.

Referring to FIG. 6 and FIG. 7, FIG. 6 is a schematic diagram illustrating a top view of an electronic device according to a second embodiment of the present disclosure, and FIG. 7 is a schematic diagram illustrating a cross-sectional view of the electronic device taken along line A-A' in FIG. 6. As shown in FIG. 6 and FIG. 7, the main difference between this embodiment and the first embodiment is that two basic units U1 including the dummy metal pads 1041 may be disposed between adjacent two light emitting diodes 106 in the electronic device 100 of this embodiment. That is to say, the pitch L2 of this embodiment may be three times the minimum pitch L3.

Figure 8:
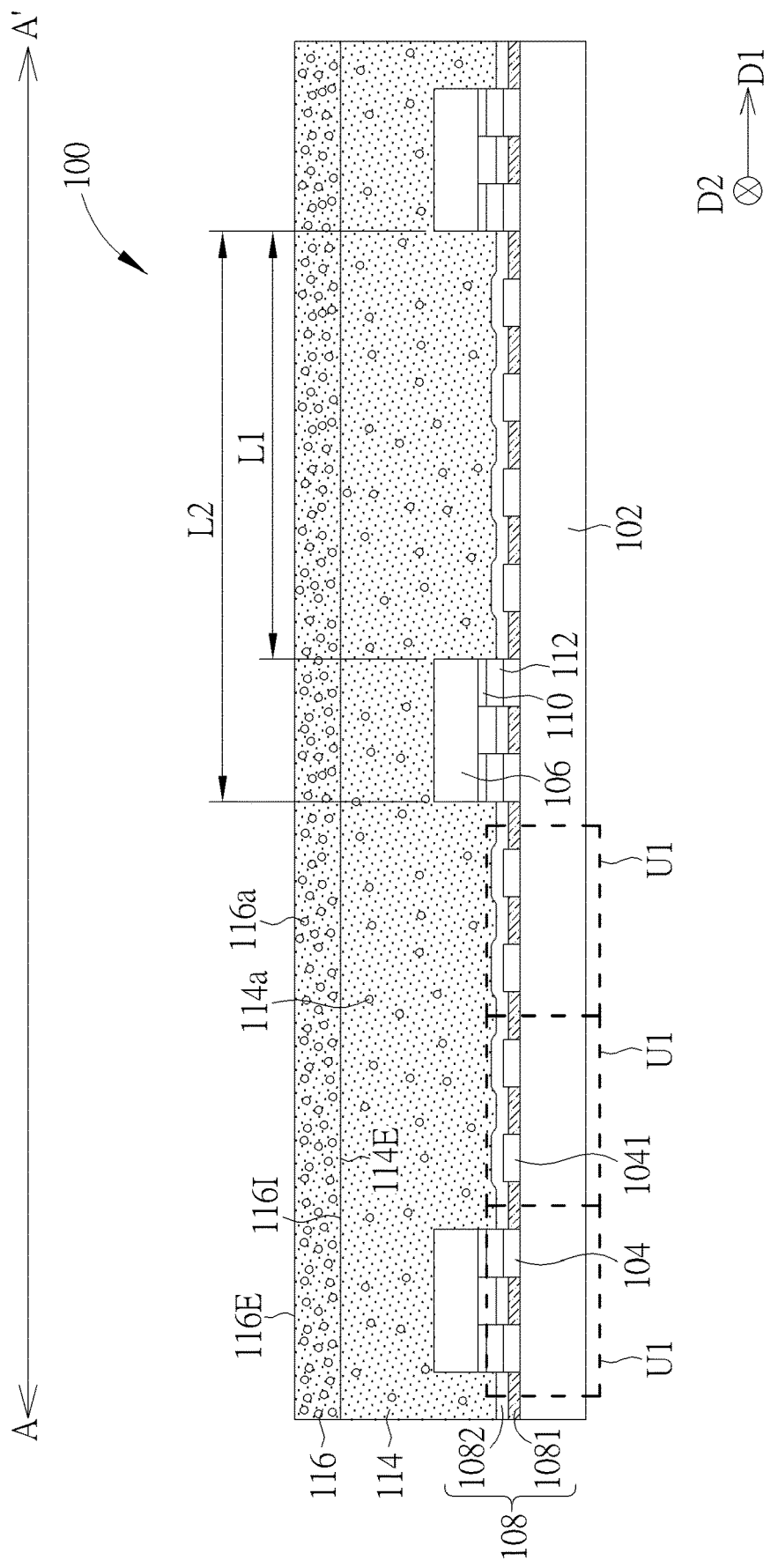
FIG. 8 is a schematic diagram illustrating a cross-sectional view of an electronic device according to a variant embodiment of the second embodiment of the present disclosure.

Referring to FIG. 8, FIG. 8 is a schematic diagram illustrating a cross-sectional view of an electronic device according to a variant embodiment of the second embodiment of the present disclosure. As shown in FIG. 8, the difference between this variant embodiment and the second embodiment is that the black paint layer 1082 may be replaced by a reflective sheet in this variant embodiment. The reflective sheet may cover the dummy metal pads 1041 between the substrate 102 and the light emitting diodes 106, and the metal pads 104 electrically connected to the light emitting diodes 106 may not be covered by the reflective sheet and may be exposed. Specifically, the electronic device 100 of this variant embodiment may be used as the backlight source of the display device for example, and the light emitting diodes 106 may be mini LEDs or micro LEDs, but not limited thereto. The reflective sheet may be a white reflective sheet for example, the reflective sheet may be used for reflecting the light emitted by the light emitting diodes 106, and the light output ratio or the uniformity of the backlight source may be enhanced accordingly, but not limited thereto. Additionally, the first diffusion layer 114 and the second diffusion layer 116 may further be included in the electronic device 100 of this variant embodiment, such structure may be similar to the structure of one of the variant embodiments of the first embodiment described above, and therefore it will not be redundantly described herein. The difference between this variant embodiment and one of the variant embodiments of the first embodiment described above is that the first diffusion layer 114 may further fill the space between adjacent light emitting diodes 106, but not limited thereto.

Figure 9:
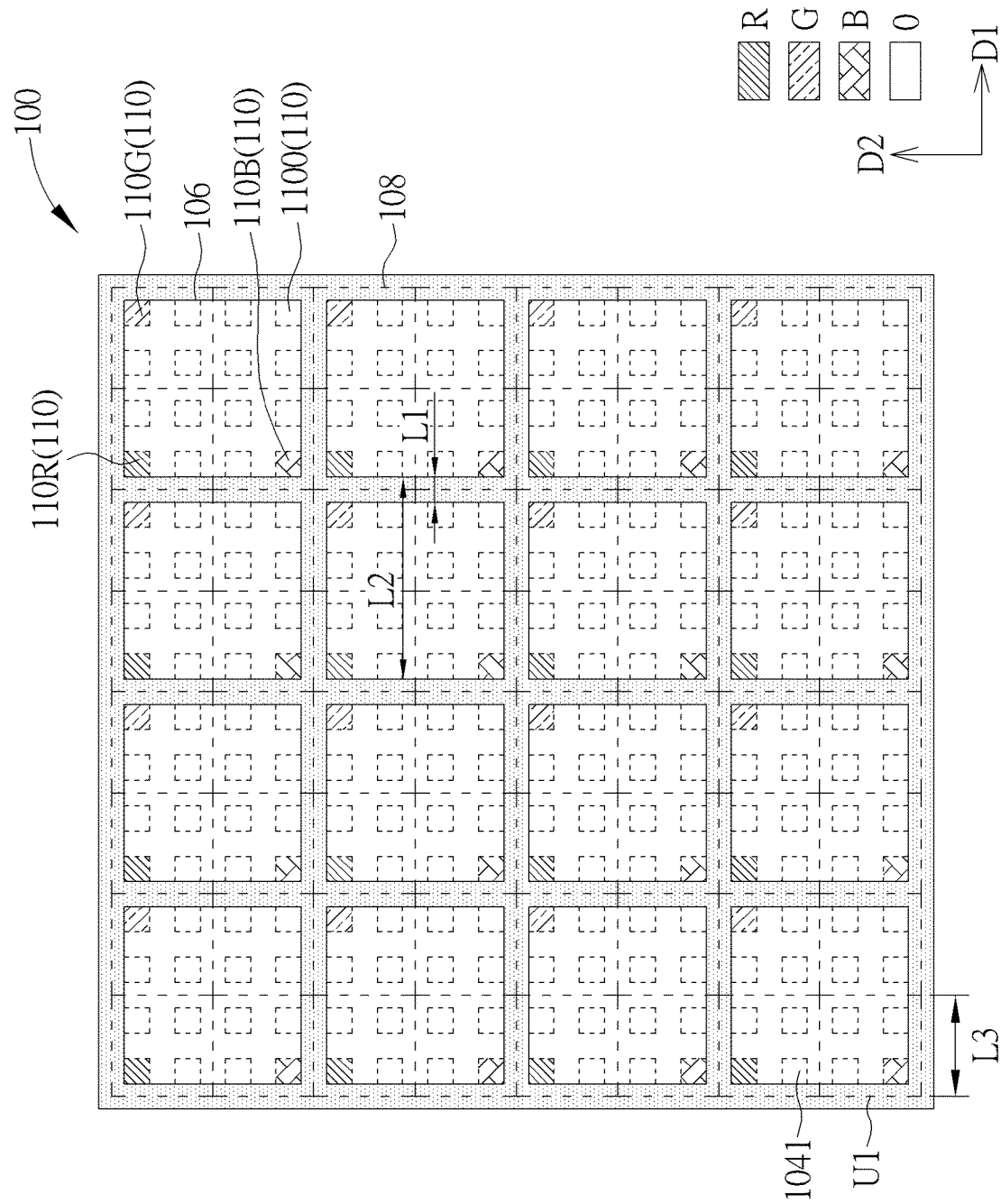
FIG. 9 is a schematic diagram illustrating a top view of an electronic device according to a third embodiment of the present disclosure.

Referring to FIG. 1 and FIG. 9, FIG. 9 is a schematic diagram illustrating a top view of an electronic device according to a third embodiment of the present disclosure. As shown in FIG. 1 and FIG. 9, the difference between this embodiment and the first embodiment is that the size of each of the light emitting diodes 106 is larger in this embodiment. For example, the area of each of the light emitting diodes 106 in this embodiment may be four times the area of each of the light emitting diodes 106 in the first embodiment, and each of the light emitting diodes 106 may cover four basic units U1, but not limited thereto. The light emitting diodes 106 of this embodiment are disposed on the substrate 102 shown in FIG. 1, and four conductive pads 1100, 110G, 110R, and 110B of each of the light emitting diodes 106 may respectively cover and electrically connect the metal pad 1040, the metal pad 104G, the metal pad 104R, and the metal pad 104B disposed in different basic units U1 on the substrate 102. Although the other metal pads 104 in these basic units U1 are covered by the corresponding light emitting diode 106, these metal pads 104 are electrically isolated to the corresponding light emitting diode 106, and these metal pads 104 may be defined as the dummy metal pads 1041. Therefore, although the electronic device 100 of this embodiment includes the light emitting diodes 106 with larger areas, the electronic device 100 of this embodiment can still use the same substrate 102 as the electronic device including light emitting diodes with smaller areas in the above embodiments. In this embodiment, the pitch L2 of the light emitting diodes 106 may be, for example, greater than twice the minimum pitch L3, but not limited thereto.

Figure 10:
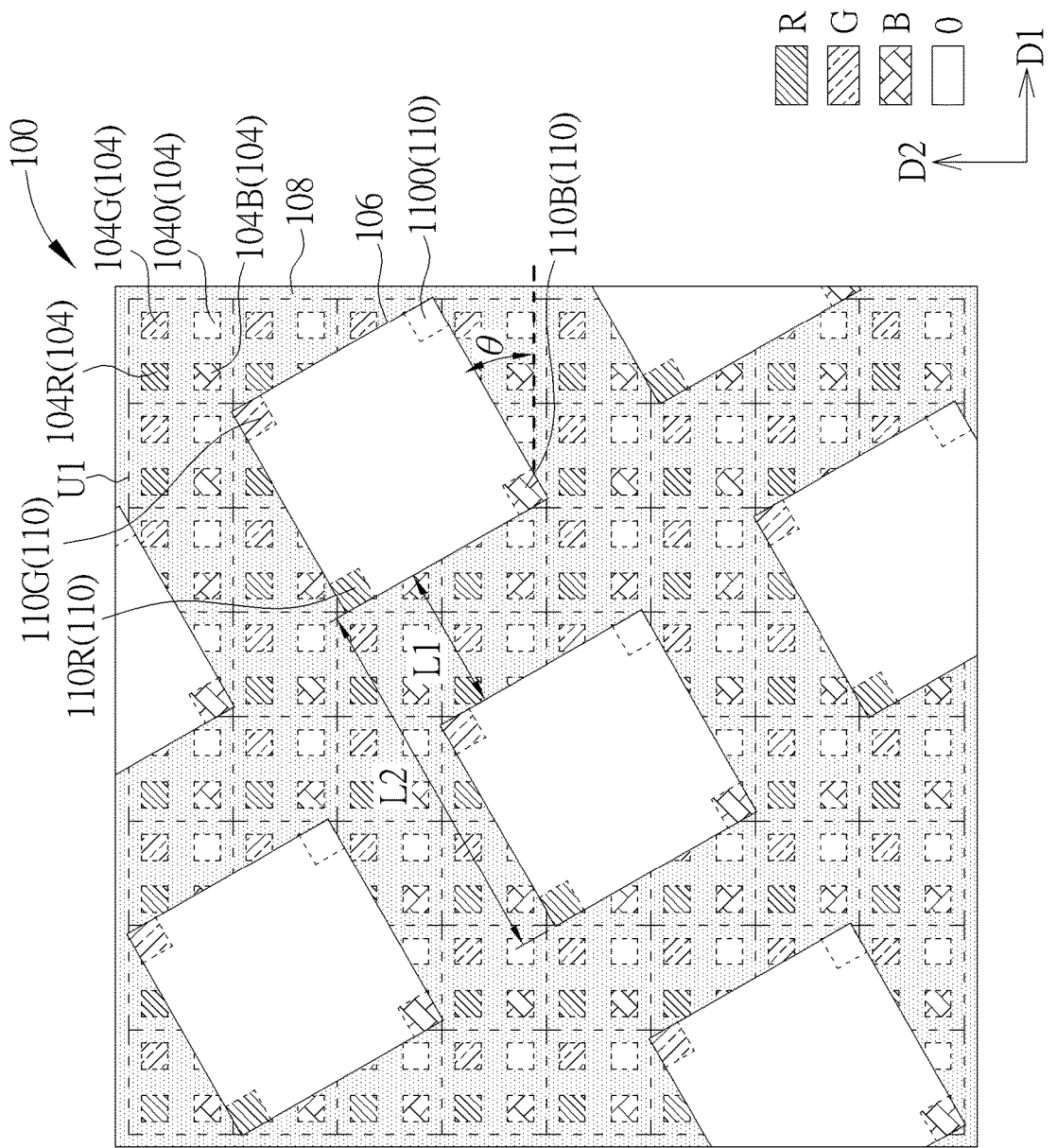
FIG. 10 is a schematic diagram illustrating a top view of an electronic device according to a first variant embodiment of the third embodiment of the present disclosure.

Referring to FIG. 1 and FIG. 10, FIG. 10 is a schematic diagram illustrating a top view of an electronic device according to a first variant embodiment of the third embodiment of the present disclosure. As shown in FIG. 10, the difference between this variant embodiment and the third embodiment is that the light emitting diodes 106 disposed on the substrate 102 in this variant embodiment are rotated by an angle. Additionally, in this variant embodiment, the adjacent light emitting diodes 106 may be spaced apart with the gap L1, and the lengths of the light emitting diodes 106 may be different from or identical to that of the third embodiment, thereby adjusting the pitch L2 of the light emitting diodes 106. Specifically, the light emitting diodes 106 are rotated by an angle θ and disposed on the substrate 102, and the angle θ is an angle included between one of the side edges of the light emitting diode 106 and the first direction D1. In a normal direction perpendicular to the surface of the substrate 102, each of the rotated light emitting diodes 106 may cross multiple basic units U1, and each of the conductive pads 110 of the light emitting diode 106 may cover and electrically connect one of the metal pads 104. For example, the light emitting diode 106 may include multiple chips, and these chips may respectively be electrically connected to the metal pad 104R, the metal pad 104G, the metal pad 104B, and the metal pad 104O in different basic units U1 through the conductive pad 110R, the conductive pad 110G, the conductive pad 110B, and the conductive pad 110O, but not limited thereto. In this variant embodiment, the metal pad 104R, the metal pad 104G, the metal pad 104B, and the metal pad 104O respectively electrically connected to the conductive pad 110R, the conductive pad 110G, the conductive pad 110B, and the conductive pad 110O of the light emitting diode 106 may be disposed in different horizontal directions or vertical directions, but not limited thereto. In this variant embodiment, the pitch L2 of the light emitting diodes 106 may be, for example, greater than three times the minimum pitch L3, but not limited thereto.

Figure 11:
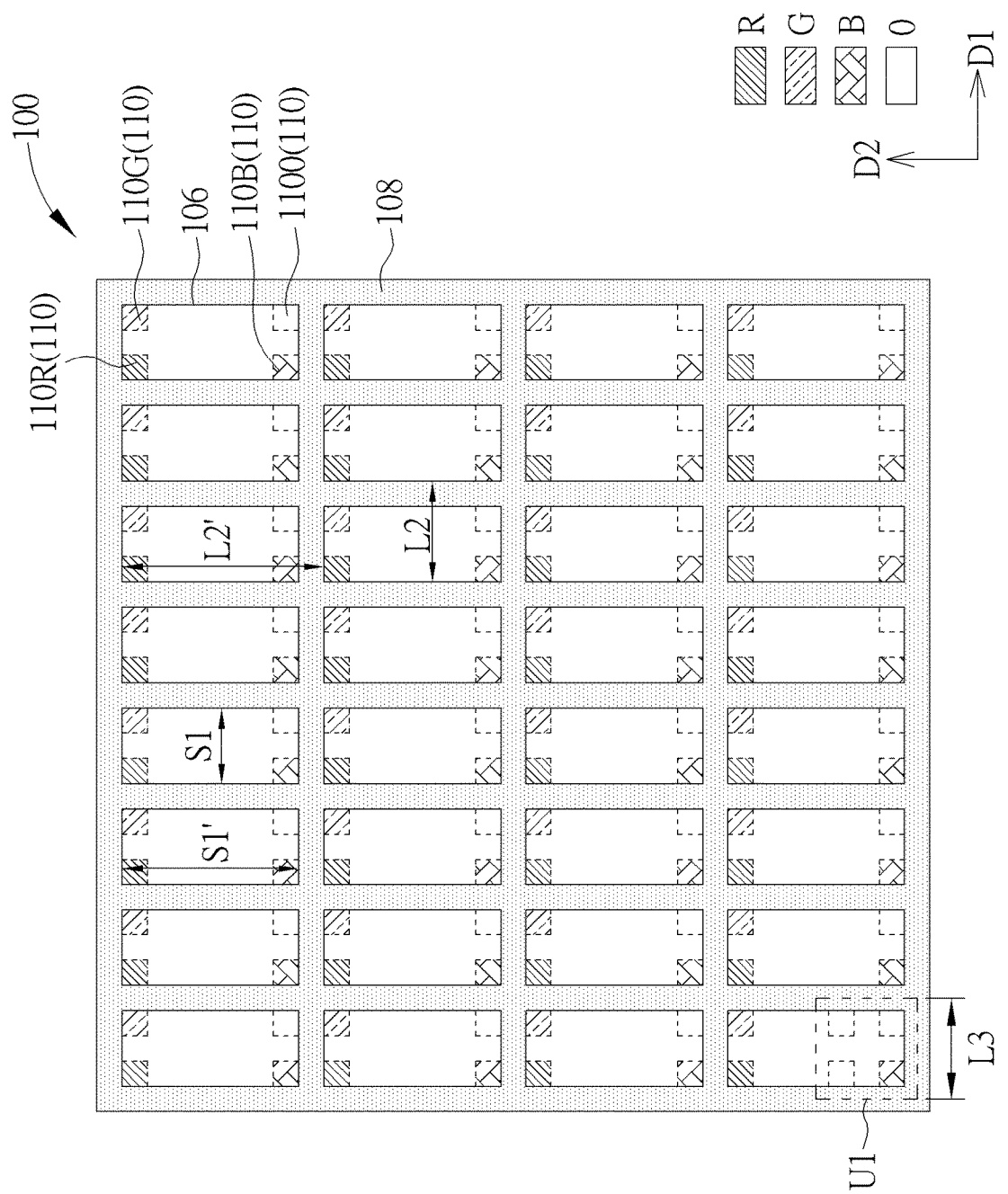
FIG. 11 is a schematic diagram illustrating a top view of an electronic device according to a second variant embodiment of the third embodiment of the present disclosure.

Referring to FIG. 11, it is a schematic diagram illustrating a top view of an electronic device according to a second variant embodiment of the third embodiment of the present disclosure. As shown in FIG. 11, the difference between this variant embodiment and the third embodiment is that the lengths of the light emitting diodes 106 in the first direction D1 and the second direction D2 are different in this variant embodiment. In this variant embodiment, the length S1 of the light emitting diode 106 in the first direction D1 may correspond to the length of one basic unit U1, and the pitch L2 of the light emitting diode 106 in the first direction D1 may be equal to the minimum pitch L3, but not limited thereto. In another aspect, a length S1' of the light emitting diode 106 in the second direction D2 may correspond to the length of two basic units U1, and therefore the pitch L2' in the second direction D2 may be twice the minimum pitch L3, but not limited thereto. Accordingly, the pitch L2 of the light emitting diode 106 in the first direction D1 is different from the pitch L2' of the light emitting diode 106 in the second direction D2.

Figure 12:
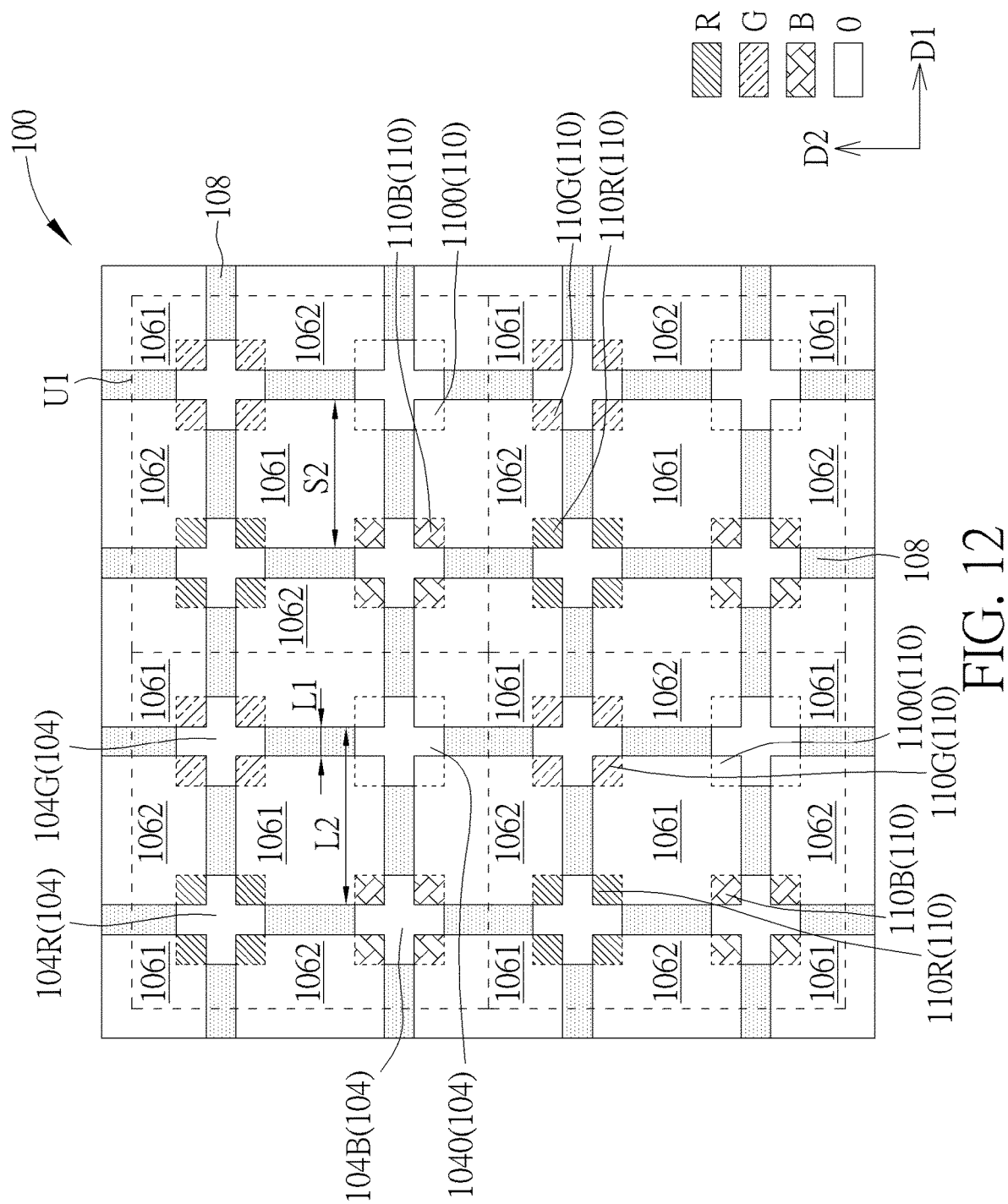
FIG. 12 is a schematic diagram illustrating a top view of an electronic device according to a third variant embodiment of the third embodiment of the present disclosure.

Referring to FIG. 12, it is a schematic diagram illustrating a top view of an electronic device according to a third variant embodiment of the third embodiment of the present disclosure. In order to clearly illustrate the structure of this variant embodiment, only a portion of the top view of the electronic device is shown for illustration. As shown in FIG. 12, the difference between this variant embodiment and the first embodiment is that the light emitting diodes of the electronic device 100 in this variant embodiment include the light emitting diodes 1061 and the light emitting diodes 1062. The length of the light emitting diode 1061 and the length of the light emitting diode 1062 may be the same, but not limited thereto. The conductive pads 110 of the light emitting diodes 1061 may be disposed according to a first type of arrangement, and the conductive pads 110 of the light emitting diodes 1062 may be disposed according to a second type of arrangement. For example, when FIG. 12 is viewed from the top view direction, the conductive pads 110O, 110G, 110R, and 110B of the light emitting diode 1061 may be disposed in the counterclockwise order at the lower right, upper right, upper left, and lower left of the light emitting diode 1061 according to the first type of arrangement, and the conductive pads 110O, 110G, 110R, and 110B of the light emitting diode 1062 may be disposed in the clockwise order at the upper right, lower right, lower left, and upper left of the light emitting diodes 1062 according to the second type of arrangement, but not limited thereto. Different from the first embodiment, the size (e.g. length, width, or area) of the light emitting diode 1061 and the size of the light emitting diode 1062 in this variant embodiment may be less than that of the light emitting diode 106 in the first embodiment, that is, the length S2 of the light emitting diode 1061 and the length S2 of the light emitting diode 1062 in this variant embodiment may be less than the length S1 of the light emitting diode 106 in the first embodiment in the first direction D1 and/or the second direction D2. Additionally, the length of the conductive pad 110 of the light emitting diode 1061 and the length of the conductive pad 110 of the light emitting diode 1062 may be less than the length of the conductive pad 110 of the light emitting diode 106 in the first embodiment. Further, as shown in FIG. 12, the length of the conductive pad 110 of the light emitting diode 1061 and the length of the conductive pad 110 of the light emitting diode 1062 are less than the length of the metal pad 104. For example, the length of the conductive pad 110 of the light emitting diode 1061 and the length of the conductive pad 110 of the light emitting diode 1062 may be equal to or less than half of the length of the metal pad 104. In other words, the area of the metal pad 104 may be four times or more than four times the area of the conductive pad 110 of the light emitting diodes 1061 and the area of the conductive pad 110 of the light emitting diode 1062, but not limited thereto. Different from the above-mentioned embodiments, the area of the light emitting diode 1061 and the area of the light emitting diode 1062 may be less than the area of the basic unit U1 in this variant embodiment.

Accordingly, as shown in FIG. 12, the light emitting diodes 1061 and the light emitting diodes 1062 may be disposed alternately in the first direction D1 and/or the second direction D2, the conductive pads 110O, 110G, 110R, and 110B of the light emitting diode 1061 may respectively be disposed adjacent to the same conductive pads 110O, 110G, 110R, and 110B of the light emitting diode 1062 adjacent thereto and electrically connected to the same metal pads 1040, 104G, 104R, and 104B. Specifically, the conductive pad 1100 of the light emitting diode 1061 and the conductive pad 1100 of the light emitting diode 1062 adjacent in the first direction D1 may be electrically connected to the same metal pad 1040 for example. Additionally, as shown in FIG. 12, two or more than two adjacent conductive pads 110 may be electrically connected to the same metal pad 104 by rotating a portion of the light emitting diodes 1061 and/or the light emitting diodes 1062 one hundred and eighty degrees and setting them at corresponding positions in the array of the metal pads 104, and the conductive pad 1100 of the light emitting diode 1061 and the conductive pad 1100 of the light emitting diode 1062 adjacent in the second direction D2 may be electrically connected to the same metal pad 1040, but not limited thereto. Therefore, one of the metal pads 1040 of this variant embodiment may be electrically connected to the conductive pads 1100 of four adjacent light emitting diodes 1061 and 1062 simultaneously. The light emitting diodes 1061 and the light emitting diodes 1062 may form an array on the array of the metal pads 104. Additionally, different from the third embodiment, the gap L1 between adjacent light emitting diodes 1061, 1062 in this variant embodiment may be less than the gap L1 between adjacent light emitting diodes 106 in the third embodiment, and the pitch L2 between adjacent light emitting diodes 1061, 1062 may be less than the length of the basic unit U1. For example, the pitch L2 may be less than or equal to half of the length of the basic unit U1, but not limited thereto. In addition, different from the above-mentioned embodiments, since the density of the light emitting diodes is increased in this variant embodiment, the frame rate of the electronic device 100 can be correspondingly increased (by two times for example), but not limited thereto.

Figure 13:
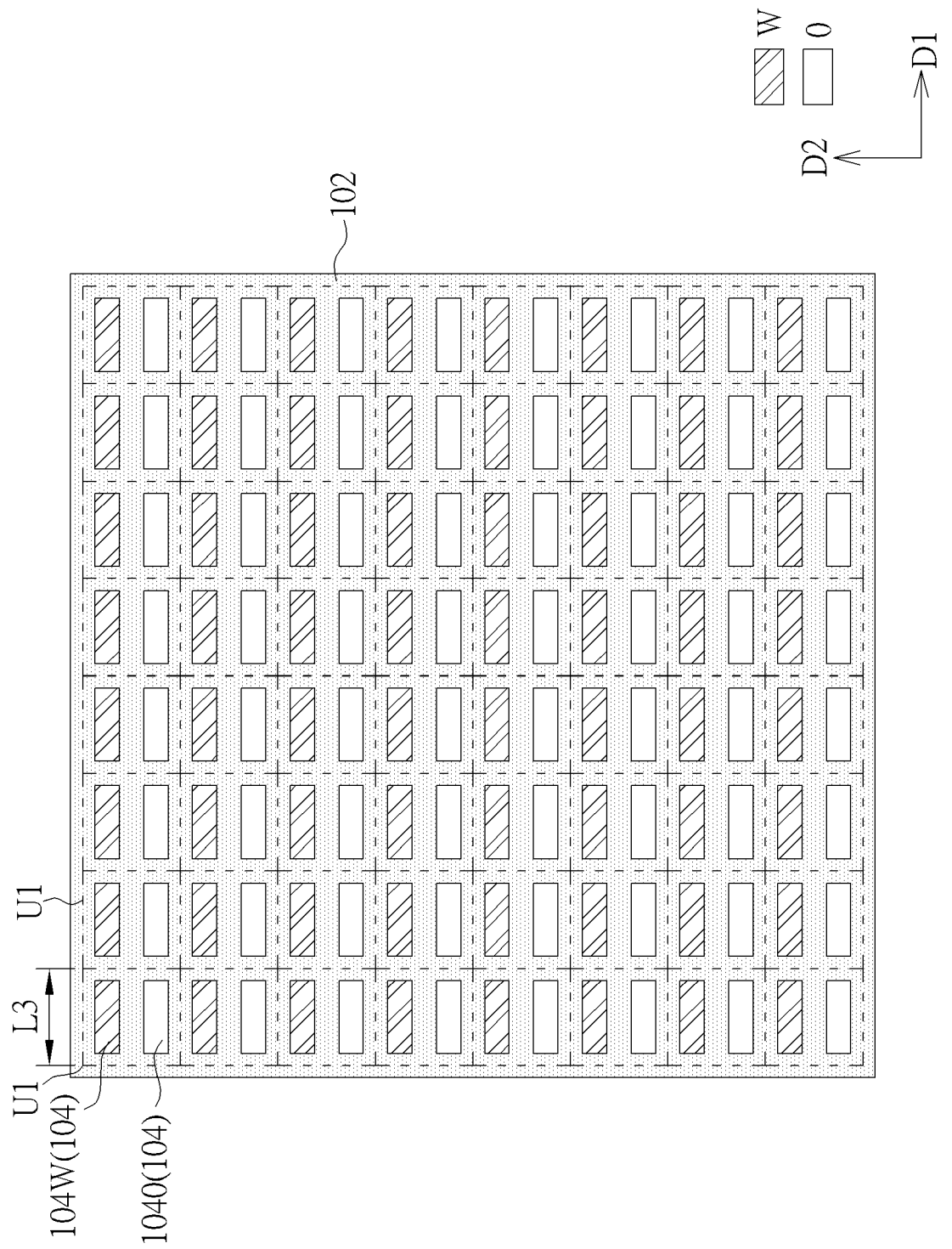
FIG. 13 is a schematic diagram illustrating a top view of a substrate of an electronic device according to a fourth embodiment of the present disclosure.
Figure 14:
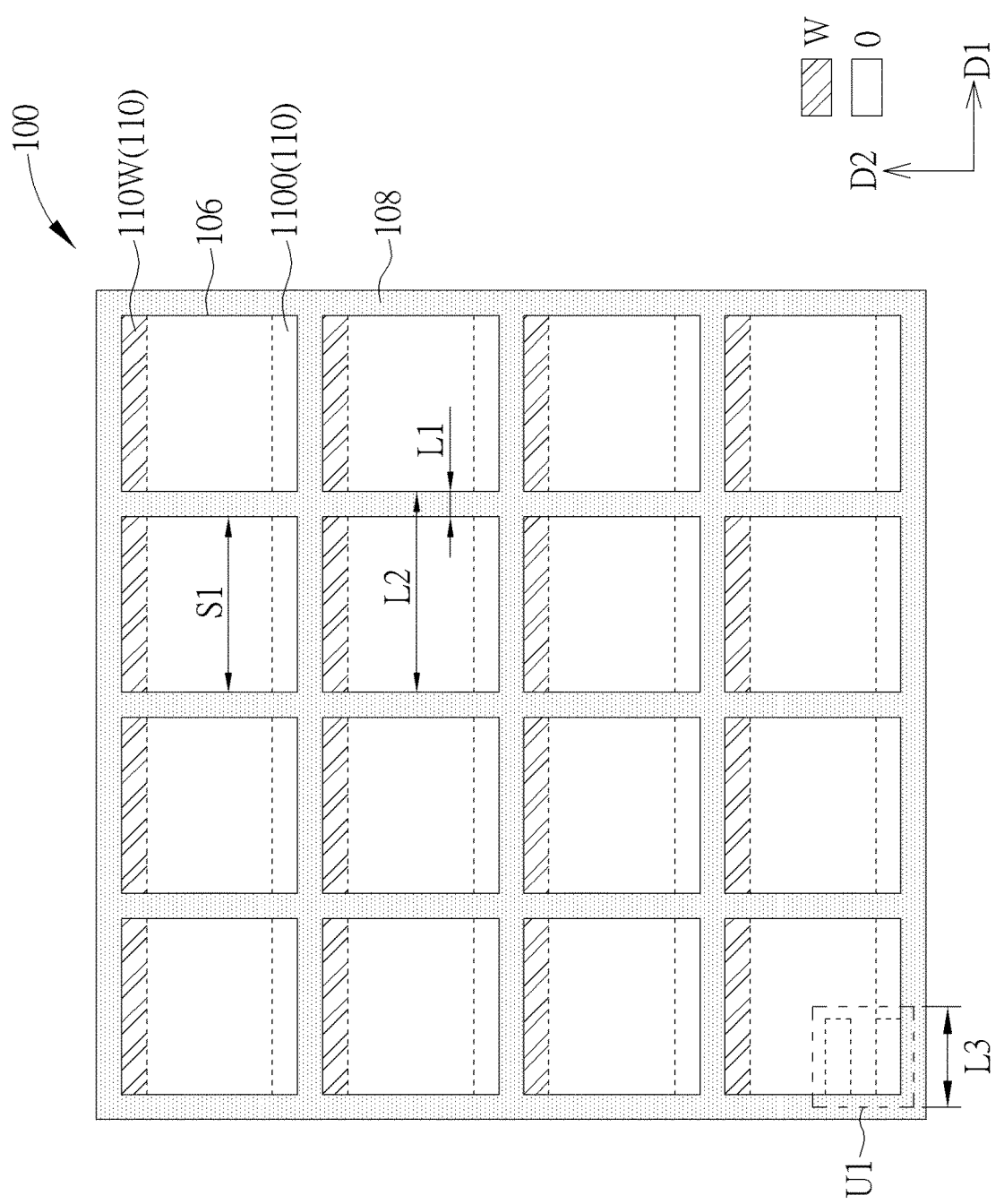
FIG. 14 is a schematic diagram illustrating a top view of the electronic device according to the fourth embodiment of the present disclosure.

Referring to FIG. 13 and FIG. 14, FIG. 13 is a schematic diagram illustrating a top view of a substrate of an electronic device according to a fourth embodiment of the present disclosure, and FIG. 14 is a schematic diagram illustrating a top view of the electronic device according to the fourth embodiment of the present disclosure. The substrate 100 of this embodiment is similar to the substrate of the first embodiment, and the identical features between them will not be redundantly described. As shown in FIG. 13, the difference between this embodiment and the first embodiment is that each of the metal pads 104 has long strip shape in this embodiment, and the direction that the metal pads 104 have longer lengths is parallel to the first direction D1. Each of the basic units U1 may include two metal pads 104, such as a metal pad 104W and a metal pad 104O. As shown in FIG. 13, the pitch L2 of the light emitting diodes 106 in this embodiment may be twice the minimum pitch L3, and the size (e.g. length, width, or area) of the light emitting diode 106 may be similar to that of in the third embodiment. The length of a conductive pad 110W and the length of a conductive pad 1100 of the light emitting diode 106 in the first direction D1 may be greater than the length of the metal pad 104 in the first direction D1 in this embodiment, but not limited thereto. Therefore, the conductive pad 110W and the conductive pad 1100 respectively may be electrically connected to multiple metal pads 104W and multiple metal pads 1040. Different from the third embodiment, the contact area of the conductive pad 110W and the metal pads 104 and the contact area of the conductive pad 1100 and the metal pads 104 can be increased in this embodiment. In addition, the light emitting diode 106 of this embodiment may include multiple chips (not shown), such as chips used for emitting red light, chips used for emitting green light, and chips used for emitting blue light, and these chips may include the common cathode or the common anode. For example, the conductive pad 110W may be used as the common anode of multiple chips and electrically connected to the metal pads 104W, and the conductive pad 1100 may be used as the common cathode of these chips and electrically connected to the metal pads 1040, but not limited thereto. Therefore, multiple chips in the light emitting diode 106 of this embodiment can simultaneously emit red light, green light, and blue light and form a mixed color light (such as white light) by conducting the common anode and the common cathode, but not limited thereto. In some embodiments, the light emitting diode 106 may include one chip for emitting light with one color. For example, the light emitting diode 106 may include a blue LED chip and yellow phosphor filled in the light emitting diode 106, and the light emitting diode 106 can emit white light, but not limited thereto.

According to the present disclosure, the electronic device includes the substrate with an array formed of plural metal pads disposed thereon. The electronic device with different LED pitches or different LED sizes can be manufactured using the same metal pad substrate due to the metal pad array of the substrate. Therefore, the fabrication and design of the metal pad substrate can be simplified, and situations that different metal pad substrates must be manufactured for different electronic devices can be reduced. In addition, some of the metal pads in the metal pad array may not be electrically connected to the light emitting diodes and they are defined as the dummy metal pads. If the dummy metal pads are exposed between adjacent light emitting diodes, the cover layer may be selectively disposed on the dummy metal pads to electrically isolate the dummy metal pads. The black paint layer may be selectively disposed on the dummy metal pads to prevent the optical performance of the electronic device from affecting by the light reflection caused by the dummy metal pads. By disposing the cover layer on the substrate or disposing the diffusion layer on the light emitting diodes, the uniformity of the emitted light or the contrast of the display image can be improved when the electronic device is used as the LED display device or the backlight source of the display device, or the issue that the quality of the display image may be affected by the reflected light caused by the ambient light incident on the display device can be solved.

Those skilled in the art will readily observe that numerous modifications and alterations of the device and method may be made while retaining the teachings of the disclosure. Accordingly, the above disclosure should be construed as limited only by the metes and bounds of the appended claims.

What is claimed is:
1. An electronic device, comprising:
a substrate;
a plurality of metal pads disposed on the substrate and forming an array; and
a plurality of light emitting diodes, each of the light emitting diodes electrically connected to at least two of the metal pads,
wherein the metal pads comprise a plurality of dummy metal pads electrically isolated to the light emitting diodes;
wherein at least one of the dummy metal pads that is not covered by the light emitting diodes is disposed between adjacent two light emitting diodes of the light emitting diodes in a top view of the electronic device;
wherein each of the light emitting diodes comprises at least two conductive pads, and the at least two con- ductive pads are electrically connected to the at least two of the metal pads; and wherein each of the conductive pads is electrically connected to more than one of the metal pads.

2. The electronic device of claim 1, wherein the light emitting diodes cover at least one or plural of the dummy metal pads.

3. The electronic device of claim 1, wherein a gap is defined by a distance between adjacent two light emitting diodes of the light emitting diodes in a direction, a pitch is defined by a sum of a length of one of the light emitting diodes and the gap in the direction, and the pitch is 1.2 times to 20 times the length of the one of the light emitting diodes in the direction.

4. The electronic device of claim 1, further comprising a cover layer covering the substrate and at least a portion of the dummy metal pads.

5. The electronic device of claim 4, wherein another portion of the dummy metal pads protrude from the cover layer.

6. The electronic device of claim 4, wherein the cover layer comprises an insulating layer and a colored paint layer disposed on the insulating layer.

7. The electronic device of claim 4, wherein the cover layer comprises a reflective sheet.

8. The electronic device of claim 1, further comprising:
a first diffusion layer disposed on the light emitting diodes,
wherein a light emitted by the light emitting diodes is diverged by the first diffusion layer and emitted from a light emitting surface of the first diffusion layer.

9. The electronic device of claim 8, wherein the first diffusion layer fills in a space between adjacent two light emitting diodes of the light emitting diodes.

10. The electronic device of claim 8, further comprising:
a second diffusion layer disposed on the first diffusion layer,
wherein a light emitted from the light emitting surface of the first diffusion layer is further diverged by the second diffusion layer and emitted from a light emitting surface of the second diffusion layer.

11. The electronic device of claim 10, wherein a thickness of the first diffusion layer is greater than a thickness of the second diffusion layer.

12. The electronic device of claim 10, wherein a haze of the first diffusion layer is less than a haze of the second diffusion layer.

13. The electronic device of claim 12, wherein the haze of the first diffusion layer is less than 50%, and the haze of the second diffusion layer is greater than or equal to 50%.

14. The electronic device of claim 10, wherein the first diffusion layer comprises a plurality of first light diffusion beads and the second diffusion layer comprises a plurality of second light diffusion beads, and a density of the second light diffusion beads in the second diffusion layer is greater than a density of the first light diffusion beads in the first diffusion layer.

15. The electronic device of claim 1, wherein an area of each of the metal pads is four times or more than four times of an area of each of the conductive pads.

16. The electronic device of claim 1, wherein a pitch of the light emitting diode in a first direction is different from a pitch of the light emitting diode in a second direction.

17. The electronic device of claim 1, wherein each of the metal pads has long strip shape.

* * * * *